United States Patent

Takeda et al.

[11] Patent Number: 5,939,835
[45] Date of Patent: Aug. 17, 1999

[54] DISCHARGE LAMP LIGHTING DEVICE WITH POWER SYSTEM, CONTROL SYSTEM AND POWER SOURCE SYSTEM

[75] Inventors: Hitoshi Takeda; Toru Nakayama; Goichi Oda; Masayasu Yamashita, all of Shizuoka, Japan

[73] Assignee: Koito Manufacturing Co., Ltd., Tokyo, Japan

[21] Appl. No.: 08/842,537

[22] Filed: Apr. 15, 1997

[30] Foreign Application Priority Data

Apr. 18, 1996 [JP] Japan .................................. 8-096475

[51] Int. Cl.⁶ .............................. H05K 1/14; H05B 37/02
[52] U.S. Cl. ................................ 315/209 R; 315/DIG. 5; 315/308; 361/816; 307/10.1
[58] Field of Search ............................. 315/DIG. 5, 308, 315/224, 209 R, 82; 361/816; 174/35 R; 307/10.1

[56] References Cited

U.S. PATENT DOCUMENTS 5,545,955  8/1996  Wood ........................................ 315/224

*Primary Examiner*—Arnold Kinkead
*Attorney, Agent, or Firm*—Sughrue, Mion, Zinn, Macpeak & Seas, PLLC

[57] ABSTRACT

A discharge lamp lighting device for turning on a discharge lamp, including: a power system which generates a high voltage, the power system having a grounding line; a control system having an analog circuit which has a grounding line, and a digital circuit which has a ground wire, the control system for controlling the power system; and a power source system for generating voltages to drive the power system and the control system, wherein the grounding line of the power system, the grounding line of the analog circuit in the control system and the grounding line of the digital circuit in the control system are provided independently of each other.

14 Claims, 6 Drawing Sheets

DISCHARGE LAMP LIGHTING DEVICE WITH POWER SYSTEM, CONTROL SYSTEM AND POWER SOURCE SYSTEM

BACKGROUND OF THE INVENTION

This invention relates to a device for lighting a discharge lamp in which a discharge bulb is a light source (hereinafter referred to as "a discharge lamp lighting device", when applicable), and more particularly to a discharge lamp lighting device with a lighting circuit whose output is stabilized.

Recently, research has been conducted on the application of a lamp whose light source is a discharge bulb which is high in luminous efficiency, excellent in color rendering property and long in service life to a head-light of an automobile. A lamp of this type needs a high voltage to cause electric discharge in the discharge bulb. Hence, it is necessary to equip the lamp with a lighting device which increases the voltage of a vehicle battery to the aimed high voltage. The lighting device is accommodated in a metal casing, and is set together with the lamp, or on the vehicle body near the lamp. Therefore, it is necessary that the lighting device is reduced in size and in weight as much as possible. In order to meet this requirement, the present inventor has conducted intensive research on the employment of a printed circuit board for the formation of a lighting circuit forming the lighting device except a starter circuit section using relatively bulky components; i.e., the formation of a DC-AC conversion circuit section adapted to convert the DC voltage of the vehicle battery into a high AC voltage.

On the other hand, the following facts have been found through a variety of experiments: In the case where the DC-AC conversion circuit section is formed on one printed circuit board, the output voltage is low in stability. The cause for this difficulty is as follows: The DC-AC conversion circuit section comprises: a power system for generating a high voltage which is applied to the starter circuit section; a control system for controlling various circuit sections forming the power system; and a power source system for supplying power to drive the power system and the control system. Therefore, if those systems are formed on one and the same printed circuit board, noises produced by the power system adversely affect the control system and the power source system, so that control signal noises and power source noises are produced. Those noises result in erroneous control operations, or they adversely affect the stability of the power source voltage, so that the lighting device becomes unstable in operation.

On the other hand, the control system is made up of analog circuits and digital circuits. Hence, noises due to the on-off operations of the digital circuits adversely affect the analog signals. Since the analog signals in those systems are employed as voltage and current detection signals in the power system, noises are mixed with the detection values of the detection signals; that is, the output voltage is varied by the noises.

The above-described difficulties may be eliminated by spacing the power system and t he control system away from each other, or by providing a shield wall between them. However, this method is not practical, because in order to space the power system and the control system away from each other or to provide the shield wall between them, it is necessary to increase the space as much which is to be occupied by those systems, which is an obstruction against the miniaturization of the lighting circuit. In addition, it is necessary to prevent the noises produced by the digital circuits from being applied to the analog circuits. To do so, similarly as in the above-described case, it is necessary to space those circuits away from each other, or to provide a shield wall between them. This fact will further make it difficult to miniaturize the light circuit.

SUMMARY OF THE INVENTION

Accordingly, an object of the invention is to eliminate the above-described difficulties accompanying a conventional lighting device. More specifically, an object of the invention is to provide a lighting device which is free from erroneous operation and is improved in stability, and which is miniaturized.

According to a first aspect of the invention, there is provided a discharge lamp lighting device for turning on a discharge lamp, comprising: a power system which generates a high voltage, the power system having a grounding line; a control system having an analog circuit which has a grounding line, and a digital circuit which has a ground wire, the control system for controlling the power system; and a power source system for generating voltages to drive the power system and the control system, wherein the grounding line of the power system, the grounding line of the analog circuit in the control system and the grounding line of the digital circuit in the control system are provided independently of each other.

In the discharge lamp lighting device described above, the grounding lines of the analog circuit and the digital circuit in the control system are connected to the grounding line of the power system at an input end of the power system.

In the discharge lamp lighting device above, the power system, the control system, and the power source system are formed on three printed circuit boards, respectively, the printed circuit board of the power system including a grounding line, the printed circuit boards are fixedly set as one unit, and the analog circuit and the digital circuit of the control system which are formed on the respective printed circuit board include grounding lines, respectively, which are electrically connected to the grounding line formed on the printed circuit board of the power system.

In the discharge lamp lighting device above, the power system comprises: a DC—DC converter circuit which receives a DC voltage from a battery through the input circuit which serves as a filter circuit, and increases the DC voltage; an additional circuit which detects the voltage thus increased and a current thereof; and a full-bridge circuit which converts the DC voltage thus increased into an AC voltage, wherein the grounding lines of the analog circuit and the digital circuit of the control system are connected to the grounding line between the input circuit and the DC—DC converter circuit.

DETAILED DESCRIPTION OF THE PREFERRED EMBODIMENTS

A preferred embodiment of the invention will be described with reference to the accompanying drawings.

Figure 1A:
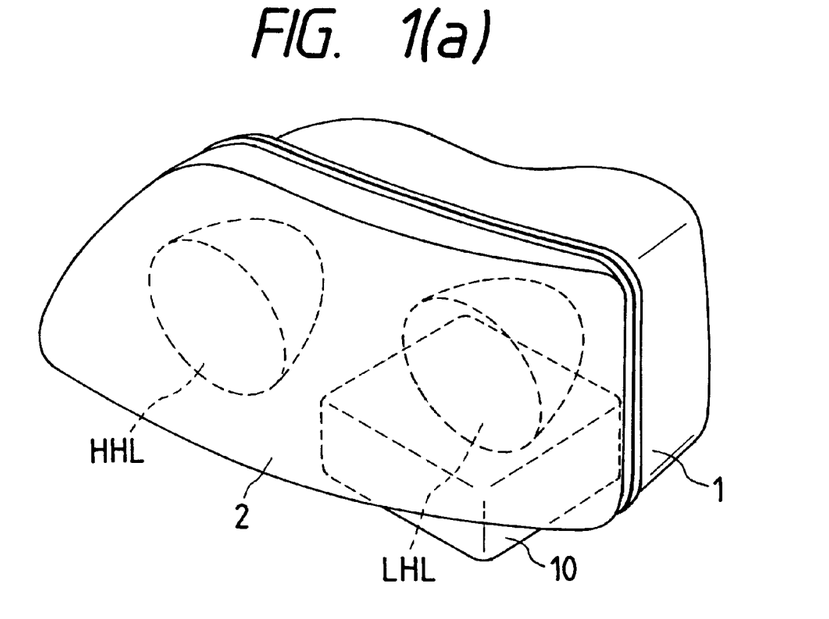
FIGS. 1(a) and 1(b) are perspective and front views of a lamp to which the technical concept of the invention is applied.
Figure 1B:
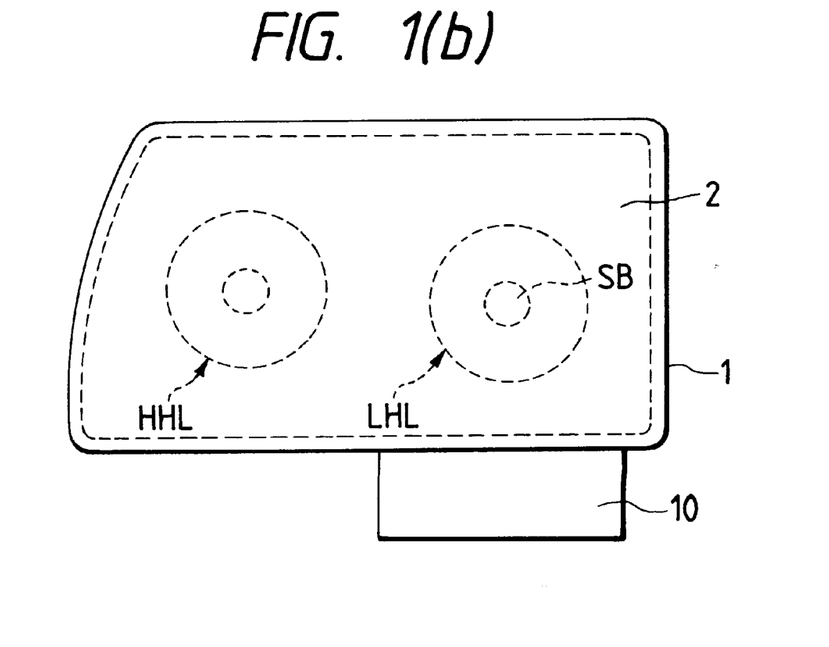

FIGS. 1(a) and 1(b) are a perspective view and a front view, respectively, outlining a discharge lamp lighting device of the invention which is to turn on a vehicle headlight. The head-light comprises: a lamp chamber which is made up of a lamp body 1 and a lens 2; and a main beam lamp HHL and a low beam lamp LHL which are provided as one unit. In the head-light, the light source of the low beam lamp is a discharge lamp bulb SB. A lighting device 10 for applying high voltage to the discharge lamp bulb SB is fixedly mounted on the bottom of the lamp body 1.

Figure 2:
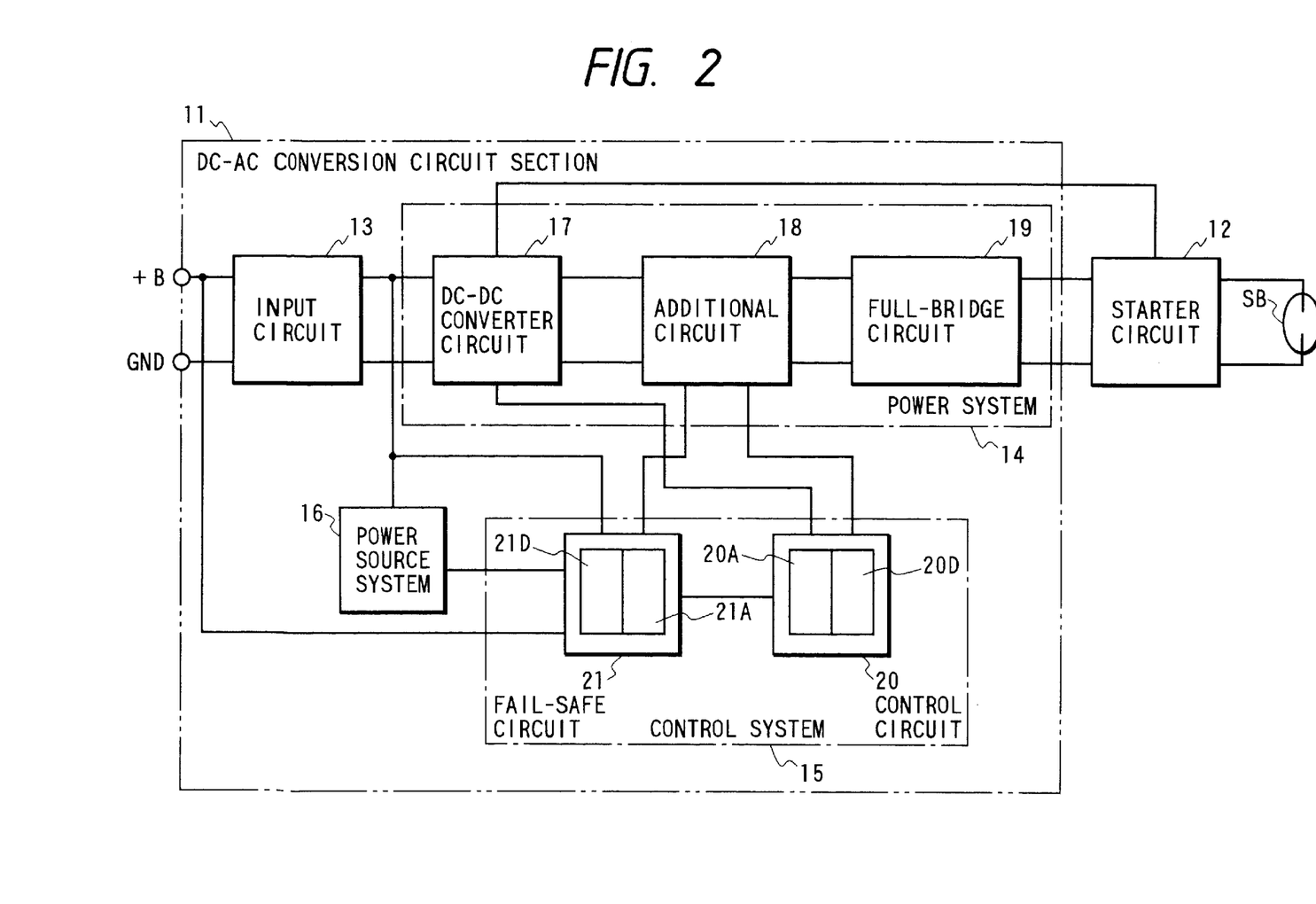
FIG. 2 is a block diagram of a lighting circuit.

FIG. 2 is a block diagram showing a lighting circuit which forms the aforementioned lighting device 10. The lighting circuit comprises: a DC-AC conversion circuit section 11 which converts the DC voltage of a vehicle battery to a high AC voltage; and a starter circuit 12 which utilizes the high AC voltage to turn on the discharge bulb SB. The DC-AC conversion circuit section 11 comprises: an input circuit 13 which serves as a filter to remove ripple components from the DC voltage of the vehicle battery; a power system 14 which obtains a high AC voltage from a DC voltage outputted from the input circuit 13; a control system 15 for controlling the power system 14; and a power source system 16 which supplies low voltages to the power system 14 and the control system 15.

The power system 14 comprises: a DC—DC converter circuit 17 adapted to convert the DC voltage of the vehicle battery to a higher DC voltage; an additional circuit 18 which detects the output voltage and output current of the DC—DC converter circuit 17 and applies them to the control system; and a full-bridge circuit 19 adapted to convert the high DC voltage of the DC—DC converter circuit 17 into a high AC voltage. The control system 15 comprises: a control circuit 20 which controls the operating condition of the power system according to the detection output of the aforementioned additional circuit 18; and a fail-safe circuit 21 which, when the operation of the power system 14 becomes abnormal, stops the operation of the system 14. The power source system 16 is a power source circuit which forms VCC voltages according to the DC voltage of the vehicle battery to drive the power system 14 and the control system 15. In the control system 15, the control circuit 20 is made up of a digital circuit 20D and an analog circuit 20A, and the fail-safe circuit 21 is also made up of a digital circuit 21D and an analog circuit 21A.

The aforementioned starter circuit 12 is designed as follows: That is, it produces a starter pulse to break down the discharge bulb SB in response to a signal from the DC—DC converter circuit 17, and thereafter maintains the discharge of the discharge bulb SB with the high voltage AC voltage which is applied thereto through the full-bridge circuit 19. In the embodiment, the DC-AC conversion circuit section 11 is formed on one printed circuit board, and the starter circuit 12 is formed on another printed circuit board; however, those circuits 11 and 12 are accommodated in one circuit casing.

Figure 3:
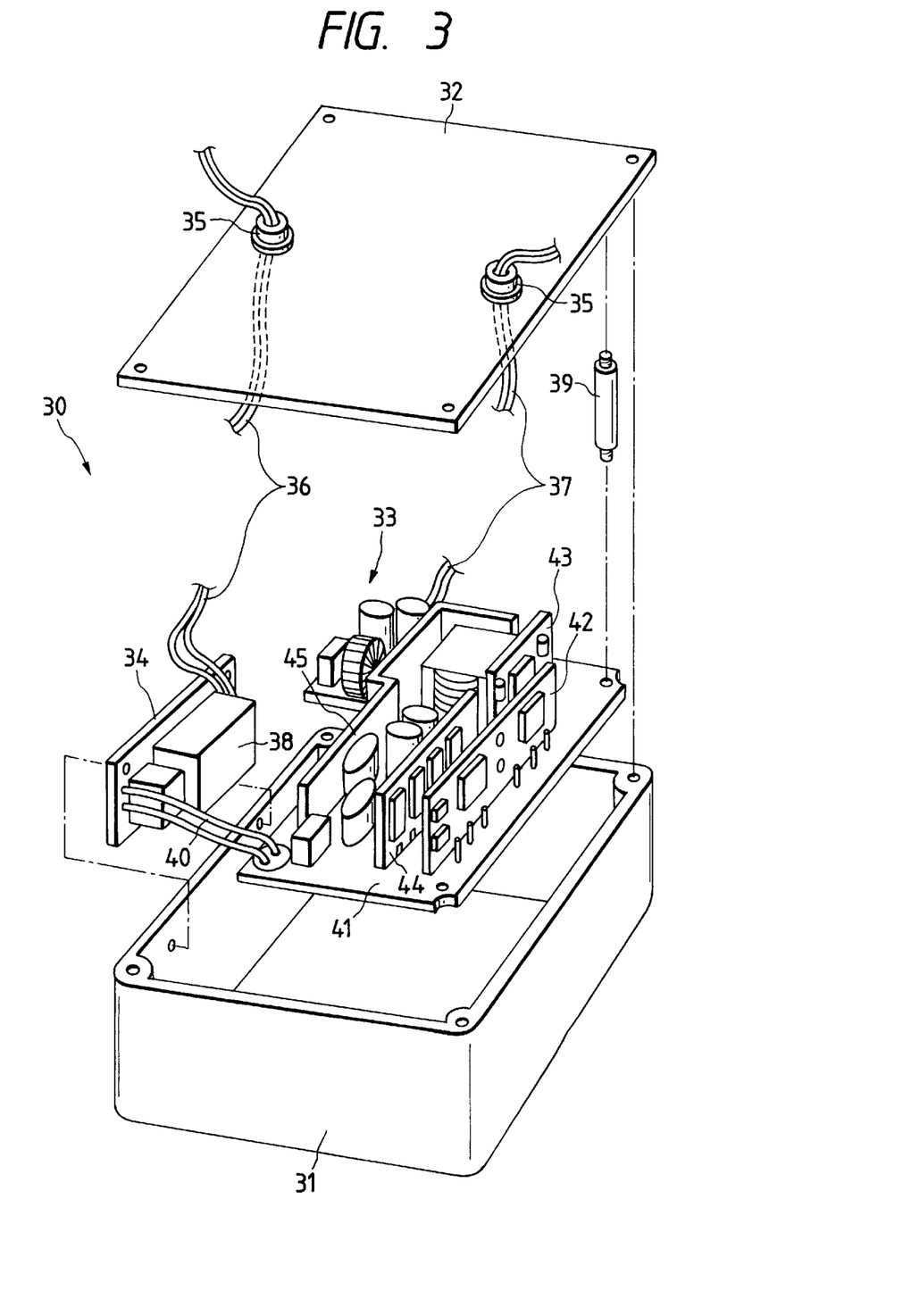
FIG. 3 is an exploded perspective view of a lighting circuit casing according to the invention.

FIG. 3 is an exploded perspective view showing parts of a lighting circuit casing 30 in which the above-described lighting circuit is accommodated. The lighting circuit casing 30 comprises; a rectangular-container-shaped casing body 31; and a cover plate 32 which closes the upper opening of the casing body 31. The casing body 31 accommodates a printed circuit board structure 33 which forms the DC-AC conversion circuit section 11, and a printed circuit board 34 which forms the starter circuit section 12. The cover plate 32 prevents the entrance of water into the casing body 31. More specifically, the cover plate 32 has a packing laid along the periphery of the rear surface, and is fixedly engaged with the edge of the upper opening of the casing body through the packing with screws in such a manner that the cover plate 32 closes the casing body 31 water-tight. The cover plate 32 has two cord inserting boots 35 through which cords 36 and 37 are inserted into the casing body 31. The cord 36 is connected to the vehicle power source, and the cord 37 is connected to the discharge bulb SB of the low beam lamp LHL.

Components 38 such as a transformer and capacitors are mounted on the printed circuit board 34 forming the starter circuit section 12. The board 34 is fixedly secured to one inside surface of the casing body 31 with screws or the like. The printed circuit board structure 33 forming the aforementioned DC-AC conversion circuit section 11 is secured to the inner surface of the cover plate 32 via spacers 39 or the like. The printed circuit board 34 and the printed circuit board structure 33 are electrically connected to each other through a cord 40.

Figure 4:
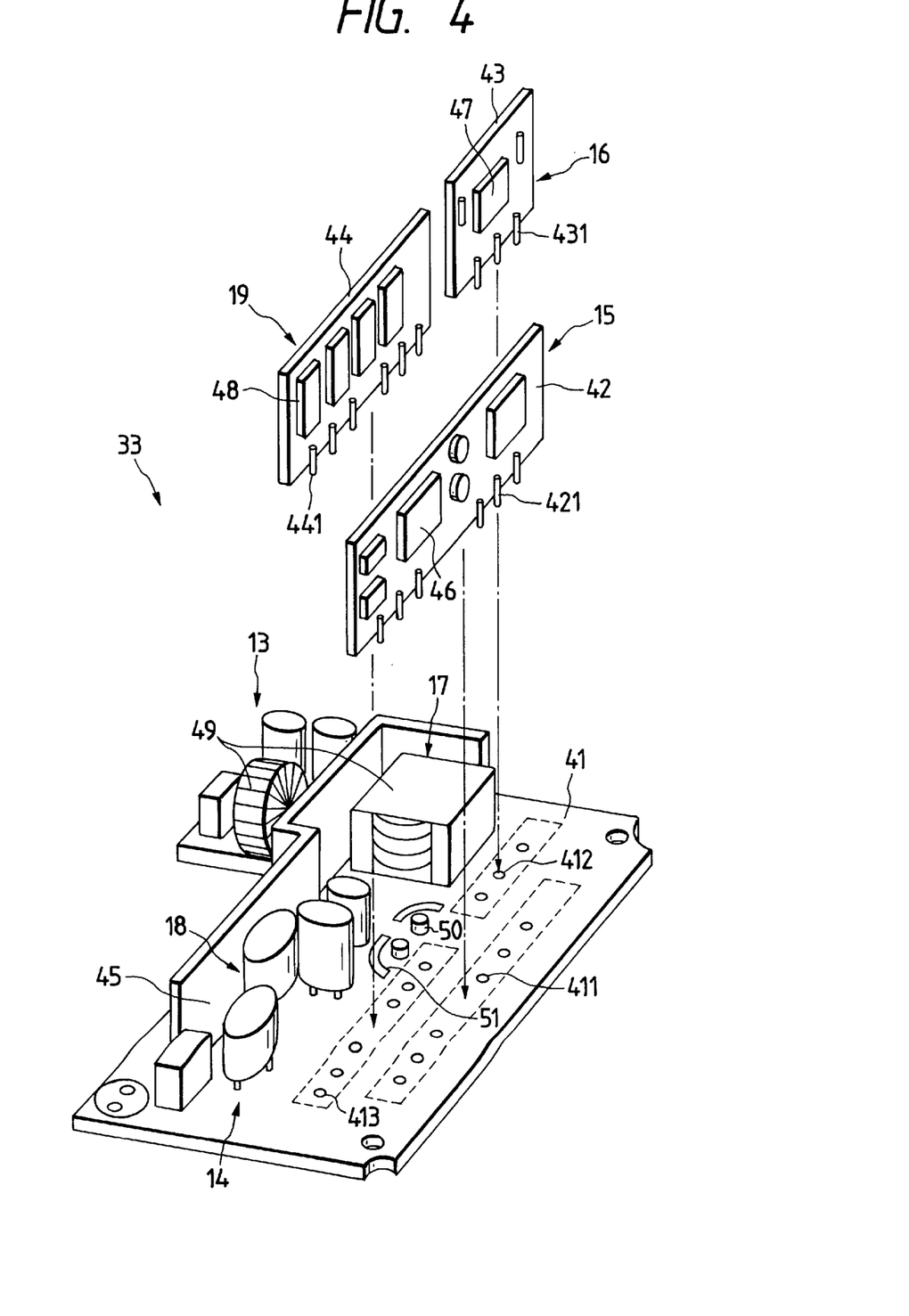
FIG. 4 is an exploded perspective view of a printed circuit board structure according to the invention.
Figure 5A:
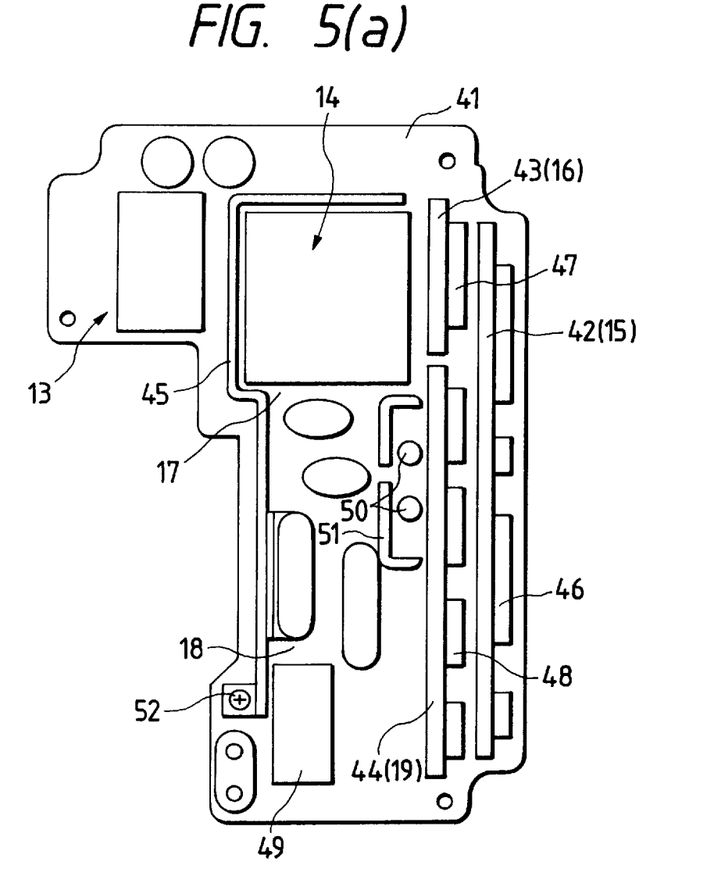
FIGS. 5(a) and 5(b) are a plan view and a front view showing the assembled printed circuit board structure.
Figure 5B:
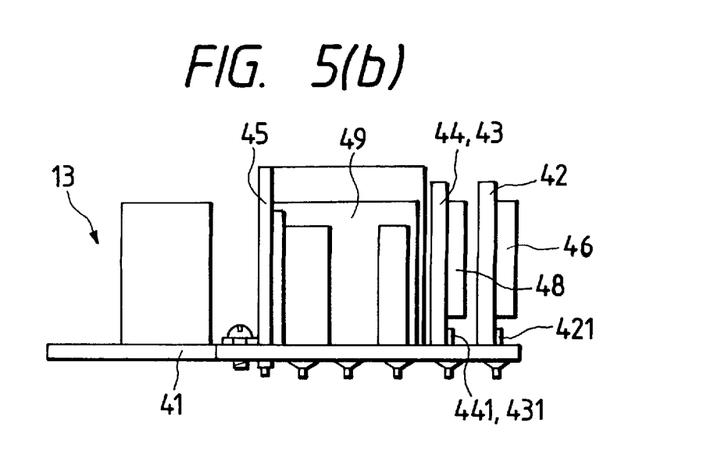

FIG. 4 is an exploded perspective view showing parts of the printed circuit board structure 33 of the DC-AC conversion circuit section 11, and FIG. 5(a) and 5(b) are a plan view and a front view, respectively, showing the printed circuit board structure 33. The printed circuit board structure 33 essentially comprises a main printed circuit board 41 which is substantially rectangular so that it is mounted on the bottom of the casing body 31. A plurality of sub printed circuit boards (three sub printed circuit boards 42, 43 and 44 in the embodiment) are mounted on the main printed circuit board 41 in such a manner that they are arranged perpendicular to the surface of the main printed circuit board 41 and are in parallel with one another. The aforementioned plurality of spacers 39 are secured to the main printed circuit board 41 at a plurality of points. The free ends of the spacers 39 are secured to the inner surface of the cover plate 32 with screws, so that the printed circuit board structure 33 is fixedly supported on the cover plate 32. With the cover plate 32 engaged with the casing body 31, the printed circuit board structure 33 is sealingly held in the casing body 31.

The main printed circuit board is a substantially L-shaped printed circuit board. About half (½) of the area of the main printed circuit board is occupied by the input circuit 13, and by the DC—DC converter circuit 17 and the additional circuit 18. The input circuit 13 and the DC—DC converter circuit 17 need relatively bulky components 49 such as a transformer and electrolytic capacitors, and accordingly their installation spaces are relatively large, requiring a larger part of the aforementioned area which is about half of the area of the main printed circuit board. In the embodiment, a shield wall 45, which is made of a metal plate, is fixedly mounted on the main printed circuit board 41 with screws in such a manner that it covers one side of the DC—DC converter circuit 17, whereby the circuit 17 is electro-magnetically shielded from the printed circuit board 34 of the starter circuit 12 set adjacent thereto, and furthermore the shield wall 45 serves as a radiator for heat generated by some parts of the DC—DC converter circuit 17, and as a part of the grounding line of the circuit.

On the other hand, the width of each of the three sub printed circuit boards 42, 43 and 44 is smaller than the inside dimension of the casing body 31. Thus boards 42, 43 and 44 are fixedly mounted on the remaining about ½ area of the main printed circuit board in such a manner that they are perpendicular to the surface of the main printed circuit board 41. On the first sub printed circuit board 42, the control circuit 20 and the fail-safe circuit 21, which form the control system 15, are formed; on the second sub printed circuit board 43, the power source circuit of the power source system 16 is formed; and on the third sub printed circuit board 44, the full-bridge circuit 19 of the power system is formed.

The sub printed circuit board 42 has connector pins 421 on one side, the sub printed circuit board 43 has connector pins 431 on one side, and the sub printed circuit board 44 has also connector pins 441 on one side. Those connector pins 421, 431 and 441 are directly connected to connector holes 411, 412 and 413, for instance, by soldering which are formed in the main printed circuit board 41, so that the sub printed circuit boards 42, 43 and 44 are vertically held on the surface of the main printed circuit board 41, and the sub printed circuit boards are electrically connected to the main printed circuit board 41. In the embodiment, the sub printed circuit boards 42, 43 and 44 are arranged in parallel with one another.

Figure 6:
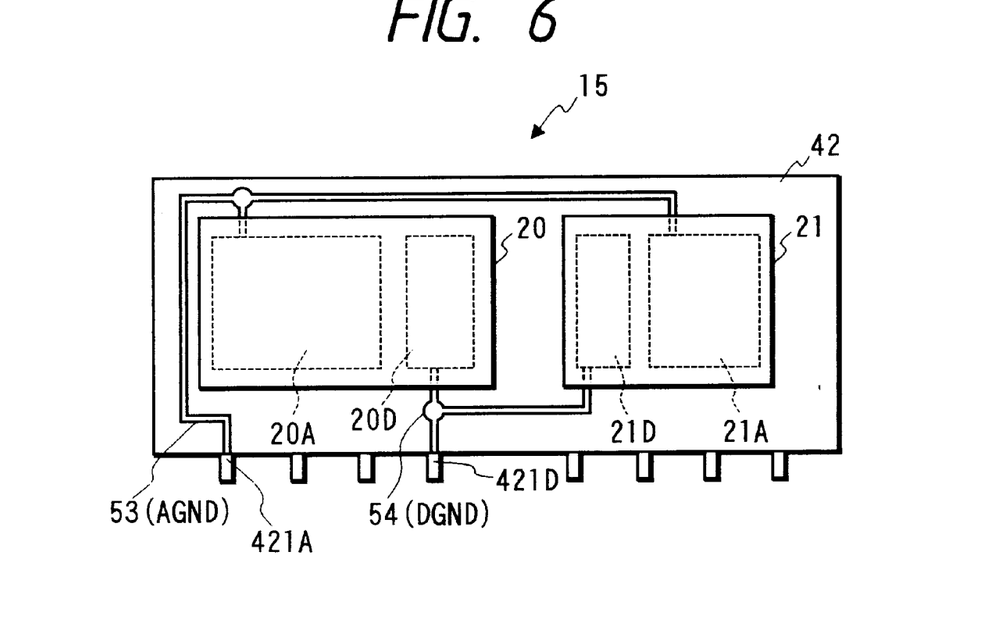
FIG. 6 is a schematic diagram showing the sub print circuit board of a control system, and the grounding lines of analog circuits and digital circuits in the control system.

In the first sub printed circuit board 42, as shown in a schematic circuit diagram of FIG. 6, the grounding lines AGND and DGND of the analog circuit portions 20A and 21A and the digital circuit portions 20D and 21D of the control circuit 20 and the fail-safe circuit 21 in the control circuit 15, are individual printed circuit patterns 53 and 54. The grounding lines AGND and DGND are connected to contact pins 421A and 421D, respectively. That is, in the control circuit 20 and the fail-safe circuit 21, the voltage and current of the power system 14 which are detected by the additional circuit 18 are received as analog signals, and, according to the result of comparison of those analog signals with reference values in comparators or the like, the analog signals are processed by digital circuits which are logic circuits. The result of this operation is utilized to control the power system 14. Hence, the grounding lines AGND and DGND of the analog circuits 20A and 21A which handle the analog signals and of the digital circuits 20D and 21D which are the logical circuits, are formed independent of each other.

Figure 7:
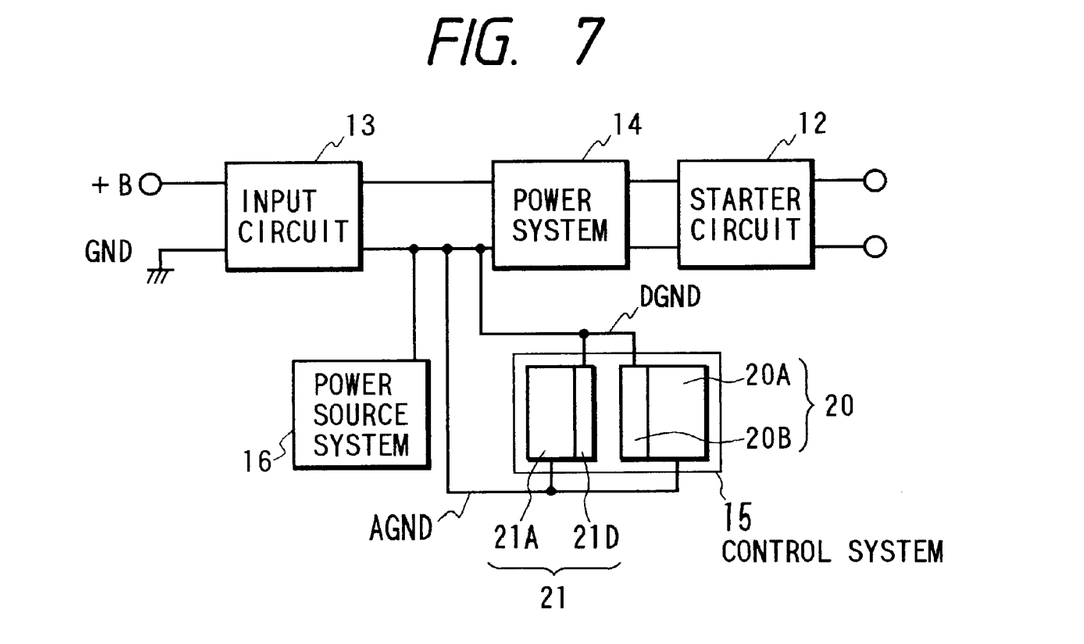
FIG. 7 is a block diagram for a description of the connection of grounding lines in the invention.

As shown in a block diagram of FIG. 7, when the first sub printed circuit board 42 is mounted on the main printed circuit board 41, the analog circuit grounding line AGND and the digital circuit grounding line DGND of the first sub printed circuit board 42, are collectively connected to the grounding line GND which connects the input circuit 13 on the main printed circuit board 41 to the input terminal of the power system; i.e., the DC—DC converter circuit 17.

Hence, in the arrangement of the printed circuit board structure 33, the grounding line GND of the power system 14, and the grounding lines AGND and DGND of the analog circuits and the digital circuits of the control system 14 are formed independent in their own regions. This feature eliminates the difficulty that a noise generated by the high voltage produced in the power system is applied through the grounding line to the control system 15, thus adversely affecting the stable operation of the system 15. Furthermore, it eliminates the difficulty that, in the control system 15, noises produced by the digital circuits 20D and 21D are applied through the grounding lines to the analog circuits 20A and 21A, to change the detection value thereby to make the operation unstable. Hence, in order to improve the stability in operation of the lighting circuit, it is unnecessary to space the digital circuits and the analog circuits of the control circuit 15 away from each other or to provide shield walls between them, which makes it possible to miniaturize the lighting device, and improve the high voltage in stability which is outputted by the power system.

As was described before, as for the whole lighting circuit, it is necessary to connect the grounding lines GND, AGND and DGND to one another. This connection is achieved at the grounding line between the input circuit 13 and the DC—DC inverter circuit 17. The input side of the DC—DC inverter circuit 17 is the region of the power system 14 which is lowest in the frequency of production of noises, and therefore the noise of the power system 14 scarcely affects the control system 15. In addition, the aforementioned connecting position is near the input circuit 13 which serves as a filter circuit. Hence, even if the noise of the power system 14 or the noises of the digital circuits of the control system 15 are transmitted through the grounding lines to the connecting position, they may be absorbed with the capacitors of the input circuit 13. Thus, the effect of noises on the analog circuits can be more effectively prevented.

In the embodiment, the circuit elements of the power system 14 are collectively provided in a half (½) of the area of the main printed circuit board 41, and the three sub printed circuit boards 42, 43 and 44 are provided in the remaining half. In addition, the third sub printed circuit board 44, on which the full-bridge circuit 19 is mounted which handles high voltage as a part of the power system, is set most adjacent to the power system 14 which is formed on the main printed circuit board 41. Hence, the high voltage region of the main printed circuit board 41 is approximately half of the area of the board 41, and the control system 15 and the power source system 16 are spaced -away from the high voltage area. This feature prevents the noise formed by the power system from adversely affecting the control system 15 and the power source system 16.

Depending on the limitation in space or in design, sometimes it is required to mount a circuit element 50 of the control system 15 or the power source system 16 on a part of the main printed circuit board 41. This requirement may be satisfied as follows: As shown in FIG. 4, a slit or slits 51 are formed in the main printed circuit board 41 in such a manner that they surround the aforementioned part of the board 41. In this case, the circuit element is electrically separated from the main printed circuit board, and the effect of the noise of the power system on the control system 15 and the power source system 16 is prevented.

In the above-described embodiment, the technical concept of the invention is applied to the lighting device for the discharge lamp which is employed as the light source of the head-light of a vehicle; however, the invention is not limited thereto or thereby. That is, the technical concept of the invention may be applied to all kinds of lighting devices which are used for lighting discharge lamps.

The lighting device according to the above described embodiment has the additional circuit 18. However, the present invention may apply to a discharge lamp lighting device which does not have such an additional circuit.

As was described above, the lighting device comprises: the power system which generates high voltage; the control system for controlling the power system; and the power source system for generating voltages to drive the power system and the control system, wherein the power system, and analog circuits and digital circuits forming the control system have their own grounding lines, which are provided independently of one another. Therefore, the leakage of noises generated by the power system or the digital circuits into the analog circuits through the grounding line can be prevented. In addition, the lighting device can be miniaturized. Furthermore, the lighting device is obtained whose output voltage is improved in stability.

What is claimed is:

1. A discharge lamp lighting device for turning on a discharge lamp, comprising:

a power system which generates a high voltage, the power system having a grounding line;

a control system having an analog circuit which has a grounding line, analog signals in said analog circuit being employed as detection signals in said power system, and a digital circuit which has a grounding line, the control system for controlling the power system; and a power source system for generating voltages to drive the power system and the control system, wherein the grounding line of the power system, the grounding line of the analog circuit in the control system and the grounding line of the digital circuit in the control system are provided independently of each other, and wherein the power system, the control system, and the power source system are formed on three printed circuit boards, respectively, the printed circuit board of the power system having the grounding line of the power system formed thereon, the printed circuit boards are fixedly set as one unit, and the grounding lines of the analog circuit and the digital circuit of the control system are formed on a respective printed circuit board and are electrically connected to the grounding line formed on the printed circuit board of the power system.

2. The discharge lamp lighting device according to claim 1, wherein the grounding lines of the analog circuit and the digital circuit in the control system are connected to the grounding line of the power system at an input end of the power system.

3. A discharge lamp lighting device for turning on a discharge lamp, comprising:

a power system which generates a high voltage, the power system having a grounding line;

a control system having an analog circuit which has a grounding line, analog signals in said analog circuit being employed as detection signals in said power system, and a digital circuit which has a grounding line, the control system for controlling the power system:

a power source system for generating voltages to drive the power system and the control system;

an input circuit; and a battery, wherein the grounding line of the power system, the grounding line of the analog circuit in the control system and the grounding line of the digital circuit in the control system are provided independently of each other, and wherein the power system comprises:

a DC—DC converter circuit which receives a DC voltage from said battery through said input circuit, and increases the DC voltage; and a full-bridge circuit which converts the DC voltage thus increased into an AC voltage, wherein the grounding lines of the analog circuit and the digital circuit of the control system are connected to the grounding line of the power system which is connected between the input circuit and the DC—DC converter circuit.

4. The discharge lamp lighting device according to claim 3, wherein the power system further comprises:

an additional circuit which detects the voltage increased by the DC—DC converter circuit and a current thereof.

5. The discharge lamp lighting device according to claim 3, wherein the power system, the control system, and the power source system are formed on three printed circuit boards, respectively, the printed circuit board of the power system having the grounding line of the power system formed thereon, the printed circuit boards are fixedly set as one unit, and the grounding lines of the analog circuit and the digital circuit of the control system are formed on a respective printed circuit board and are electrically connected to the grounding line formed on the printed circuit board of the power system.

6. A discharge lamp lighting device for turning on a discharge lamp, comprising:

a starter circuit section connecting to the discharge lamp; and a DC-AC converter circuit section having, a battery for outputting a DC voltage, an input circuit for receiving the DC voltage from said battery, a power system which generates a high voltage from the DC voltage and sends the high voltage to the starter circuit, the power system having a grounding line, a control system having an analog circuit which has a grounding line, analog signals in said analog circuit being employed as detection signals in said power system, and a digital circuit which has a grounding line, the control system for controlling the power system, and a power source system for generating voltages to drive the power system and the control system, wherein the grounding line of the power system, the grounding line of the analog circuit in the control system and the grounding line of the digital circuit in the control system are provided independently of each other, and wherein the power system comprises:

a DC—DC converter circuit which receives the DC voltage from said battery through said input circuit, and increases the DC voltage; and a full-bridge circuit which converts the DC voltage increased into an AC voltage, wherein the grounding lines of the analog circuit and the digital circuit of the control system are connected to the grounding line of the power system which is connected between the input circuit and the DC—DC converter circuit.

7. The discharge lamp lighting device according to claim 6, wherein the grounding lines of the analog circuit and the digital circuit in the control system are connected to the grounding line of the power system between the input circuit and the power system.

8. The discharge lamp highting device according to claim 6, wherein the power system further comprises:

an additional circuit which detects the voltage increased by the DC—DC converter and a current thereof.

9. The discharge lamp lighting device according to claim 6, wherein the power system, the control system, and the power source system are formed on three printed circuit boards, respectively, the printed circuit board of the power system having the grounding line of the Power system formed thereon, the printed circuit boards are fixedly set as one unit, and the grounding lines of the analog circuit and the digital circuit of the control system are formed on a respective printed circuit board and are electrically connected to the grounding line formed on the printed circuit board of the power system.

10. The discharge lamp lighting device according to claim 9, wherein the three printed circuit boards are arranged parallel to one another.

11. A discharge lamp lighting device for turning on a discharge lamp, comprising:

a starter circuit section connecting to the discharge lamp;

a DC-AC converter circuit section having,
- a battery for outputting a DC voltage,
- an input circuit for receiving the DC voltage from said battery,
- a power system which generates a high voltage from the DC voltage and sends the high voltage to the starter circuit, the power system having a grounding line,
- a control system having an analog circuit which has a grounding line, analog signals in said analog circuit being employed as detection signals in said power system, and a digital circuit which has a grounding line, the control system for controlling the power system, and
- a power source system for generating voltages to drive the power system and the control system, wherein the grounding line of the power system, the grounding line of the analog circuit in the control system and the grounding line of the digital circuit in the control system are provided independently of each other; and a metal plate, positioned between the starter circuit section and the power system of the DC-AC converter circuit section.

12. The discharge lamp lighting device according to claim 3, wherein the grounding lines of the analog circuit and the digital circuit in the control system are connected to the grounding line of the power system at an input end of the power system.

13. The discharge lamp lighting device according to claim 12, wherein the power system further comprises:

an additional circuit which detects the voltage increased by the DC—DC converter circuit and a current thereof.

14. The discharge lamp lighting device according to claim 12, wherein the power system, the control system, and the power source system are formed on three printed circuit boards, respectively, the printed circuit board of the power system having the grounding line of the power system formed thereon, the printed circuit boards are fixedly set as one unit, and the grounding lines of the analog circuit and the digital circuit of the control system are formed on a respective printed circuit board and are electrically connected to the grounding line formed on the printed circuit board of the power system.

* * * * *